Figure 1:
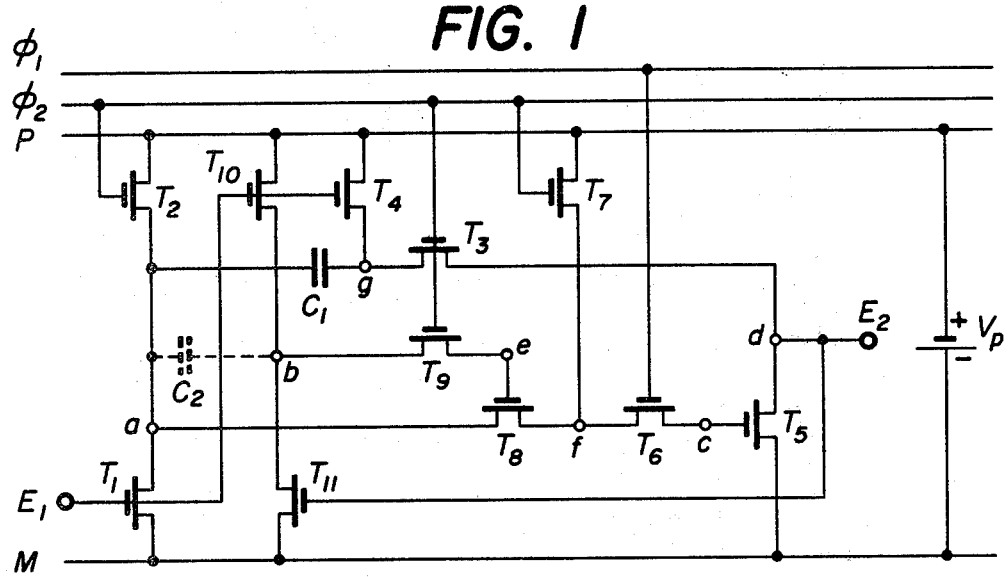

United States Patent [19]

Rusznyak

[11] 4,178,520
[45] Dec. 11, 1979

[54] BINARY FREQUENCY DIVIDER STAGES

[75] Inventor: Andreas Rusznyak, Chene-Bougeries, Switzerland

[73] Assignee: Ebauches S.A., Neuchâtel, Switzerland

[21] Appl. No.: 913,378

[22] Filed: Jun. 7, 1978

[30] Foreign Application Priority Data

Jun. 8, 1977 [CH] Switzerland ................ 7041/77

[51] Int. Cl.² ........................................ H03K 23/30
[52] U.S. Cl. ........................... 307/255 C; 58/23 A; 307/224 C
[58] Field of Search ........... 307/220 C, 224 C, 225 C, 307/251, 279; 58/23 A, 50 R

[56] References Cited

U.S. PATENT DOCUMENTS

| | | | |
|---|---|---|---|
| 3,383,570 | 5/1968 | Lüscher | 307/279 X |
| 3,553,957 | 1/1971 | Döme et al. | 58/23 A |
| 3,619,644 | 11/1971 | Vittoz | 307/225 C |
| 3,619,646 | 11/1971 | Vittoz | 307/225 C |
| 3,645,088 | 2/1972 | Lüscher | 307/225 C X |
| 3,983,411 | 9/1976 | Lüscher et al. | 307/225 C |
| 4,068,137 | 1/1978 | Vittoz | 307/225 C |

OTHER PUBLICATIONS

Vittoz et al., *IEEE-Journal of Solid-State Circuits;* vol. SC-7, No. 2, pp. 100–103; 4/1972.

*Primary Examiner*—Larry N. Anagnos
*Attorney, Agent, or Firm*—Karl F. Ross

[57] ABSTRACT

A binary frequency divider stage comprises eleven insulated gate field effect transistors and a capacitor, all of which may be fabricated as an integrated circuit. The stage has an input, an output, two supply lines, and two clock lines for receiving two sets of out-of-phase clock pulses. Pulses are supplied to the input synchronously with one of the sets of clock pulses and the divider stage produces at its output pulses of half the frequency of the input pulses.

1 Claim, 2 Drawing Figures

BINARY FREQUENCY DIVIDER STAGES

The present invention relates to binary frequency divider stages.

Numerous portable devices supplied by a small battery delivering a voltage of only about 1.5 Volts are known, comprising an electronic quartz oscillator of a relatively high inherent frequency, for example of the MHz order.

In these devices, the frequency of the signal delivered by the oscillator is divided by a plurality of electronic divider stages in order to obtain a signal of relatively low frequency, suitable for use in periodically controlling another electronic circuit, or, in the case of for example a wrist watch, a display device. In order to keep their overall size and consumption low, these electronic circuits are advantageously in the form of integrated circuits.

It has already been proposed, for example in U.S.A. Pat. Nos. 3,624,408 and 3,848,200, to control the various divider stages by biphase signals produced either by an intermediate circuit incorporating a transformer disposed downstream of the oscillator, or directly by said oscillator.

Divider stages developed for control by such biphase signals include those described in the U.S.A. Pat. Nos. 3,645,088 and 3,983,411.

In the first of these, the arrangement chosen is however such that the output transistor of the divider stage ($Ta_1, Ta_2, \ldots$ in FIG. 2 of this patent), and on which the current available at the output depends, can only be controlled by a signal representing only a fraction of the voltage of the battery which supplies this stage, such that the current intensity is relatively low, thus limiting the facility for discharging the following divider stage or any other circuit in which the input is controlled by the output transistor of the divider stage under comsideration.

The circuit described in the second of these patents enables the aforesaid drawback to be effectively overcome, but it gives rise to a further very considerable drawback when the supply source for the whole device of which the divider stage forms part is constituted by a battery of low energy capacity.

In this respect, the assembly of amplifiers incorporated in an electronic demultiplier which embodies a plurality of divider stages of the type described in said U.S.A. Pat. No. 3,983,411 of a sufficiently high number to obtain signals of low frequency, for example 1 Hz, places a considerable permanent load on the oscillator, and consequently lead to an excessive and unacceptable energy consumption when it is considered that the device comprising such a demultiplier has to be able to operate, on the energy only from the battery which it contains, for a relatively long time, for example one year or more.

To overcome this drawback, a demultiplier embodying several such divider stages could be used, but controlled by biphase signals, fed for example from a circuit of the type described in U.S.A. Pat. No. 3,932,773. However, such a method has a similar drawback to that described heretofore, namely a permanent energy consumption due to the assembly of amplifiers in the demultiplier. However, this drawback is less substantial, as the frequency of the biphase signals can be relatively low, for example of the order of a few KHz.

Furthermore, it should be noted that even in the case of divider stages designed to deliver low frequency signals, it is desirable for the amplitude of these signals to be high so that they are able to cause the complete discharge of the stage following the divider stage considered, or of any other circuit connected to the output of such a stage.

To satisfy this requirement, even though the amplitude of the biphase signal in a method of this type is of low value corresponding to the direct current supply voltage of the battery, it is necessary for the capacitors incorporated in the amplifier of each stage to be of high capacity. However, the result is a large and undesirable increase in consumption. Furthermore, high capacity can be equated to higher manufacuring cost, because of the fact that the surface occupied on an integration crystal (substrate) of the (integrated) circuit is necessarily greater than that which would be occupied by a similar circuit which has capacitors of low capacity.

According to the invention there is provided a binary frequency divider comprising:

an input terminal for receiving pulses, the frequency of which is to be divided;

an output terminal at which the divider frequency signals are to be delivered;

an electronic circuit comprising a plurality of insulated control electrode field effect transistors of the same type of conduction each having two secondary electrodes and a control electrode, and at least one storage capacitor having two plates, the circuit being disposed between the input and output terminal;

a first and a second supply line for said circuit, for connection to a source of direct current, said first line constituting the common point of said electronic circuit;

a first control line for said circuit, for receiving a first series of control pulses having a frequency equal to n times the frequency of the pulses to be divided, a being a positive whole number other than 0, and arranged to be fed in synchronism with the pulses to be divided; and a second control line for said circuit, for receiving a second series of control pulses of the same frequency as the pulses of the first series, but in phase operation thereto;

the first and second transistors of the plurality of transistors being connected in series via one of their secondary electrodes and being connected by their other secondary electrode to the first supply line in the case of the first transistor and to the second supply line in the case of the second transistor, the control electrode of the first transistor being connected to the input terminal and the control electrode of the second transistor being connected to the second control line;

the third and fourth transistors being connected in series via one of their secondary electrodes, and being connected via their other secondary electrode to the output terminal in the case of the third transistor and to the second supply line in the case of the fourth transistor, the control electrode of the third transistor being connected to the second control line and the control electrode of the fourth transistor being connected to the input terminal;

the storage capacitor being connected, via one of its plates, to the point of connection of the first transistor to the second transistor, and via its other plate to the point of connection of the third transistor to the fourth transistor;

the fifth transistor being connected via one of its secondary electrodes to the first supply line and via its other secondary electrode to the output terminal;

the sixth and seventh transistors of the plurality of transistors being connected in series via one of their secondary electrodes, and being connected via their other secondary electrode to the control electrode of the fifth transistor in the case of the sixth transistor and to the second supply line in the case of the seventh transistor, the control electrode of the sixth transistor being connected to the first control line and the control electrode of the seventh transistor being connected to the second control line;

the eighth transistor being connected via one of its secondary electrodes to the point of connection of the sixth transistor to the seventh transistor and via its other secondary electrode to the point of connection of the first transistor to the second transistor;

the ninth and tenth transistors being connected in series via one of their secondary electrodes, and being connected via their other secondary electrode to the control electrode of the eight transistor in the case of the ninth transistor and to the second supply line in the case of the tenth transistor, the control electrode of the ninth transistor being connected to the second control line, and the control electrode of the tenth transistor being connected to the input terminal; and the eleventh transistor being connected via one secondary electrode to the first supply line, via the other secondary electrode to the point of connection of the ninth transistor to the tenth transistor, and via its control electrode to the output terminal.

Figure 2:
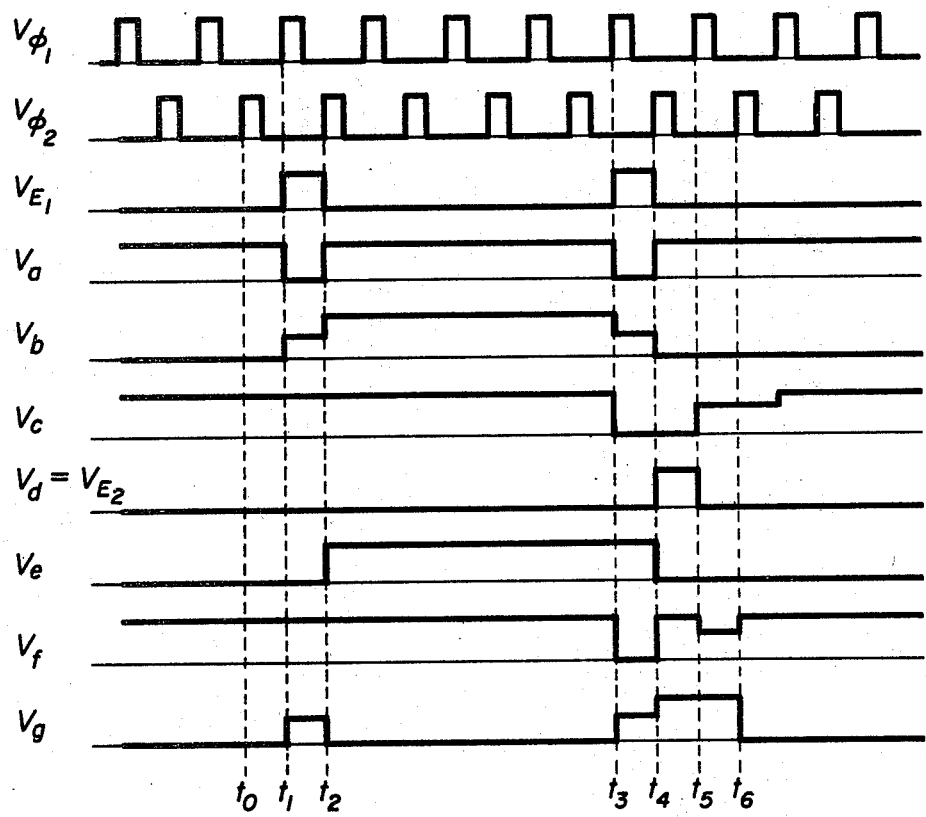

The invention will be further described, by way of example, with reference to the accompanying drawings, in which:

FIG. 1 is an electrical circuit diagram of a preferred frequency divider stage; and FIG. 2 is a group of diagrams illustrating the operation of the divider stage of FIG. 1.

The divider stage of FIG. 1 can be placed either at the head of an electronic frequency divider comprising several of such stages, or in an intermediate position or at the end of such a demultiplier.

The divider step incorporates eleven insulated control electrode field effect transistors (IGFET), $T_1$ to $T_{11}$, of the same type of conduction, and a capacitor $C_1$. These transistors and the capacitor are constituted by $n^+$ type semiconductor regions, integrated into a p type crystal, and metallised electrodes fixed on to insulating layers. As a modification, it would be possible to construct such a divider stage by integrating type $p^+$ regions into an n type crystal.

The divider stage represented is supplied from two lines P and M, the line M constituting the common point of the circuit. These lines P and M are connected to the poles of a direct current voltage source $V_p$, for example a battery, while control is effected by two different lines $\phi_1$ and $\phi_2$, connected to respective outputs of a periodic biphase voltage generator, not shown, for example a circuit of the type described in U.S.A. Pat. No. 3,932,773.

As will be apparent from the description given hereinafter, the preferred divider stage is of the type which effects a binary division of the signal to be divided, in this case a signal $V_{E1}$ (see FIG. 2) which is fed to an input terminal $E_1$ of the circuit, in phase with a signal $V_{\phi 1}$ flowing through the line $\phi_1$. The divided frequency signal $V_{E2}$ emerging from this divider stage is fed to an output terminal $E_2$ in phase with the signal $V_{\phi 2}$ flowing through the line $\phi_2$.

The arrangement of the electronic components of the circuit of the divider stage shown in FIG. 1 is as follows:

The first transistor $T_1$ and the second transistor $T_2$ of the circuit are connected in series via one of their secondary electrodes, and are connected via their other secondary electrode to the line M, in the case of the transistor $T_1$, and to the line P, in the case of the transistor $T_2$. The control electrode of the transistor $T_1$ is connected to the terminal $E_1$, and the control electrode of the transistor $T_2$ is connected to the control line $\phi_2$.

The third transistor $T_3$ and fourth transistor $T_4$ of the circuit are also connected in series via one of their secondary electrodes, between the output terminal $E_2$ of the circuit and the supply line P, the transistor $T_3$ being connected to the terminal $E_2$ and the transistor $T_4$ being connected to the line P. The control electrode of the transistor $T_3$ is connected to the control line $\phi_2$, and the control electrode of the transistor $T_4$ is connected to the input terminal $E_1$.

The capacitor $C_1$, the purpose of which is essentially to store energy, is connected via one of its plates to the point of connection of the transistor $T_1$ to the transistor $T_2$, and via its other plate to the point of connection of the transistor $T_3$ to the transistor $T_4$. This capacitor can be a capacitor of conventional construction or, in one modification, not shown, a "binary" condenser (see for example the publication Electronics, Vol. 46, No. 4, pages 115–117, "Two-Level Capacitor Boosts MOS Memory performance" by L. Talamonti).

In this case, the plate constituting the control electrode of the condenser is connected to the point of connection of the transistor $T_3$ to the transistor $T_4$.

The fifth transistor of the circuit $T_5$ is connected via one secondary electrode to the line M, via its second secondary electrode to the output terminal $E_2$, and via its control electrode to one secondary electrode of the sixth transistor $T_6$, which is connected in series, via its other secondary electrode, with the seventh transistor $T_7$ of the circuit, which itself is connected to the supply line P via a secondary electrode. The control electrode of the transistor $T_6$ is connected to the control line $\phi_1$, and the control electrode of the transistor $T_7$ is connected to the control line $\phi_2$.

The eighth transistor $T_8$ of the circuit is connected via its secondary electrodes between the point of connection f of the sixth transistor $T_6$ to the seventh transistor $T_7$, and the point of connection a of the first transistor $T_1$ to the second transistor $T_2$. Its control electrode is connected to one secondary electrode of the ninth transistor $T_9$, which is connected in series via its other secondary electrode with the tenth transistor $T_{10}$, which itself is connected via a secondary electrode to the line P. The control electrode of the transistor $T_9$ is connected to the second control line $\phi_2$, while that of the transistor $T_{10}$ is connected to the input terminal $E_1$.

Finally, the eleventh transistor $T_{11}$ of the circuit is connected via one secondary electrode to the first supply line M, by its other secondary electrode to the point b of connection of the ninth transistor $T_9$ to the tenth transistor $T_{10}$, and via its control electrode to the output terminal $E_2$ of the divider stage.

The operation of the described circuit is illustrated hereinafter with reference to the various diagrams shown in FIG. 2.

It will be assumed, conventionally, that the time $t_o$ is that at which the signal $V_{\phi 2}$ flowing through the line $\phi_2$ is increasing, the signal $V_{\phi 1}$ flowing then through the line $\phi_1$ being at that moment of zero value. The maximum value of these two signals is $V_\phi = V_p$, where $V_p$ is the battery voltage.

It will be assumed that at the time $t_o$, the potential at the points, a, c and f of the circuit is such that $$V_a = V_c = V_f = V_p - V_T$$

and that the potential at the points b, d, e and g is zero ($V_T$ is the threshold voltage of the transistors).

It is apparent from the aforegoing that, as the input terminal $E_1$ receives no signal to be divided, at the time $t_o$ the transistors $T_1$, $T_4$, $T_6$, $T_8$, $T_{10}$ and $T_{11}$ are nonconducting and remain so, whereas the transistors $T_2$, $T_3$, $T_7$ and $T_9$ open (conducting), the transistor $T_5$ remaining open. It should be noted that the fact that the transistors $T_2$, $T_3$, $T_7$ and $T_9$ conduct does not result in any change of potential at the points a and g of the circuit.

When the first signal $V_{\phi 2}$ following the time $t_o$ passes, the transistors $T_2$ $T_3$, $T_7$, $T_9$ again close and the circuit is then in the state in which it was before the time $t_o$.

The time $T_1$ is that at which the first pulse of the signal $V_{E1}$ to be divided appears at the terminal $E_1$. It is also the time at which a pulse of the signal $V_{\phi 1}$ flowing through the line $\phi_1$ appears.

The arrival of this pulse $V_{E1}$ at the terminal $E_1$ causes the transistor $T_1$ to become conducting, so that the potential $V_a$ at the point a of the circuit becomes zero.

The same pulse $V_{E1}$ causes the transistor $T_4$ and $T_{10}$ to open, so that the potential of the point g of the circuit grows to a value $V_g = V_{E1} - V_T$, and the point b of the circuit grows to a value $V_b = V_{E1} - V_T$.

The transistor $T_6$, which is connected to the line $\phi_1$ by its control electrode, also becomes conducting, but because of the fact that the transistor $T_8$ remains closed, the potential $V_c$ at the point c remains unchanged and the transistor $T_5$ remains conducting.

The time $T_2$ is that at which the pulse of the signal $V_{E1}$ disappears, and the next pulse of the signal $V_{\phi 2}$ appears.

Because of this, the transistors $T_1$, $T_4$ and $T_{10}$ close, whereas the transistors $T_2$, $T_3$, $T_7$ and $T_9$ become conducting.

Because the transistor $T_2$ is open, the potential at the point a of the circuit again increases to a value of $V_a = V_p - V_T$.

If the circuit comprises a capacitor such as the capacitor $C_2$ (represented by dashed lines) connected between the points a and b, the increase in the potential at the point a causes the potential at the point b of the circuit to rise. If this is not the case, then the potential at the point b remains unchanged.

The increase in potential at the point a causes electrical charges to pass through the capacitor $C_1$ towards the point g of the circuit, where the potential again falls to zero because of the fact that the transistors $T_3$ and $T_5$, which are in a conducting state, connect the point g to the common point M of the circuit.

Furthermore, as the transistor $T_9$ connects together the points b and e of the circuit, the potential at these points becomes such that $V_b = V_e$. Because of this, the transistor $T_8$ becomes conducting and connects together the points a and f of the circuit, at these points the potential being substantially identical, i.e. $V_a \cong V_f \cong V_p - V_T$. Thus the potential at these points remains unchanged.

The time $t_3$ is that at which the next pulse of the signal $V_{E1}$ appears at the terminal $E_1$, in phase with a pulse of the signal $V_{\phi 1}$. The arrival of this pulse $V_{E1}$ causes the transistor $T_1$, $T_4$ and $T_{10}$ to open.

It follows that the potential at the point a of the circuit becomes zero.

As the transistor $T_6$ also becomes conducting, and the transistor $T_8$ is still conducting, the potential at the points f and c, $V_f$ and $V_c$, becomes zero, so that the transistor $T_5$ closes.

At time $T_4$, at which the signal $V_{E1}$ disappears and the signal $V_{\phi 2}$ again appears, the transistors $T_1$, $T_4$ and $T_{10}$ become blocked, and the transistors $T_2$, $T_3$, $T_7$ and $T_9$ become conducting.

It follows that the potential at point a returns to the value $V_a = V_p - V_T$. The same happens to the potential at the point f of the circuit. However, the potential at the point c remains zero because the transistor $T_6$ is closed.

The points g and d of the circuit are connected together via the transistor $T_3$, so that as the transistor $T_5$ is closed, the potential at the point d of the circuit rises to a value $V_{E2}$, representing the circuit output voltage for which the amplitude can be greater than that of the incident signal $V_{E1}$. This rise in potential is facilitated by the capacitor $C_1$, which contributes to this rise by capacitive coupling between the points a and g, and thus between the points a and d. The output voltage $V_{E2}$ is equal to $V_d = V_p - V_T$. This limit is due to the transistor $T_3$ becoming non-conducting when $V_d = V_p - V_T$, since its control voltage is equal to $V_\phi = V_P$.

When the signal $V_{E2}$ apprars, the transistor $T_{11}$ becomes conducting, so that the potential $V_b$ at the point b becomes zero. Moreover, as the transistor $T_9$ is open yhe potential $V_e$ at the point e also becomes zero, so that the transistor $T_8$, which was conducting, now closes.

At the time $t_5$, at which the next pulse of the signal $V_{\phi 1}$ appears, the transistors $T_2$, $T_4$, $T_7$ and $T_{10}$ are again blocked, while the transistor $T_6$ becomes conducting. Because of this, part of the charge which was stored at the point f of the circuit is transferred towards a point c thereof, so that the transistor $T_5$ again becomes conducting, and the potential at the point d, $V_d$, i.e. the potential $V_{E2}$ at the terminal $E_2$, becomes zero. Thus, a single pulse of the signal $V_{E2}$ is obtained at the terminal $E_2$ for two pulses of the signal $V_{E1}$ received at the input terminal $E_1$. The described circuit therefore represents a binary frequency divider stage.

It should be noted that the value of the potential f, $V_f$, has reduced slightly.

At the time $t_6$, at which the next pulse of the signal $V_{\phi 2}$ appears in the line $\phi_2$, the transistors $T_2$, $T_3$, $T_7$ and $T_9$ become conducting, whereas the transistor $T_6$ becomes blocked.

As the state of charge of the point c of the circuit is unchanged, the transistor $T_5$ remains conducting. At this time, the potential at the point f again rises to the value $V_f = V_P - V_T$ as it is connected to the line P via the transistor $T_7$.

Finally, as the transistor $T_3$ has opened at the time $t_6$, the charge stored at the point g is transferred towards the line M via the transistor $T_5$, so that the potential at the point g becomes zero. The various compoments of the described divider stage are thus again in the state at which they were at the time $t_o$. This stage is therefore again ready to feed to the terminal $E_2$ one new pulse $V_{E2}$ for two successive pulses $V_{E1}$ received at its terminal $E_1$.

Relative to the divider of the said U.S.A. Pat. No. 3,983,411, the divider stage described herein has important advantages which are illustrated hereinafter both qualitatively and quantitatively.

In the case of divider stages, including those designed to deliver low frequency signals, it is notably highly desirable for the amplitude of the signals to be high so that they are able to cause the complete discharge of the divider stage following such a stage, or of any other circuit connected to the output of such a stage.

In the case of a divider of the type described in the aforesaid patent, it can be shown that in order to obtain at the divider output a signal having an amplitude of $$V_a = V_P - V_T$$

where $V_P$ is the battery voltage, and $V_T$ is the threshold voltage of the transistors, the value of the capacitor C of the amplifier incorporated in such a divider must be substantially equal to $$C = C_d \cdot (V_P - V_T/V_T)$$

where $C_d$ is the capacity of the components of the circuit which are connected to the output of the divider under consideration. By way of example, in an application in which $V_P$ is the voltage of a low capacity battery, namely 1.5 Volts, and $V_T \cong 0.2$ Volts, then $$C = 6.5 C_d$$

In the case of the preferred divider stage, it can be shown that, to obtain at the stage output a signal having the same amplitude as the aforesaid signal, the value of the capacitor $C_1$ (see FIG. 1) is given as a first approximation by $$C_1 = C_d \cdot (V_P - V_T/V_P - 2V_T)$$

Where $V_P = 1.5$ Volts, and $V_T = 0.2$ Volts, as in the aforesaid case, it follows that $$C_1 \cong 1.1 C_d$$

The value of this capacitor is therefore in this case about six times less.

It follows that the surface occupied by the preferred divider stage is less than the surface occupied by the divider according to the said U.S.A. patent, and thus its manufacturing cost will be less than this latter.

Furthermore, the energy consumption can be kept at a reasonable value, on the one hand because the capacitor involved is creating the output signal of the divider stage is of low capacity, and on the other hand because this capacitor no longer constitutes a permanent load which has to be supplied by biphase signals of relatively high frequency, but instead is charged by a current originating directly from the battery, and at a frequency proportional to the frequency of the output signal of the divider stage under consideration. As this frequency is smaller the larger the number of divider stages, the number of these stages has therefore only a relative importance with regard to the total energy consumed by a demultiplier incorporating a plurality of the preferred divider stages.

I claim:

1. A binary frequency divider comprising:

- an input terminal for receiving pulses, the frequency of which is to be divided;
- an output terminal at which the divided frequency signals are to be delivered;
- an electronic circuit comprising a plurality of insulated control electrode field effect transistors of the same type of conduction each having two secondary electrodes and a control electrode, and at least one storage capacitor having two plates, the circuit being disposed between the input and output terminals;
- a first and a second supply line for said circuit, for connection to a source of direct current, said first line constituting the common point of said electronic circuit;
- a first control line for said circuit, for receiving a first series of control pulses having a frequency equal to n times the frequency of the pulses to be divided, n being a positive whole number other than 0, and arranged to be fed in synchronism with the pulses to be divided; and
- a second control line for said circuit, for receiving a second series of control pulses of the same frequency as the pulses of the first series, but in phase opposition thereto;
- the first and second transistors of the plurality of transistors being connected in series via one of their secondary electrodes and being connected by their other secondary electrode to the first supply line in the case of the first transistor and to the second supply line in the case of the second transistor, the control electrode of the first transistor being connected to the input terminal and the control electrode of the second transistor being connected to the second control line;
- the third and fourth transistors being connected in series via one of their secondary electrodes, and being connected via their other secondary electrode to the output terminal in the case of the third transistor and to the second supply line in the case of the fourth transistor, the control electrode of the third transistor being connected to the second control line and the control electrode of the fourth transistor being connected to the input terminal;
- the storage capacitor being connected, via one of its plates, to the point of connection of the first transistor to the second transistor, and via its other plate to the point of connection of the third transistor to the fourth transistor;
- the fifth transistor being connected via one of its secondary electrodes to the first supply line and via its other secondary electrode to the output terminal;
- the sixth and seventh transistors of the plurality of transistors being connected in series via one of their secondary electrodes, and being connected via their other secondary electrode to the control electrode of the fifth transistor in the case of the sixth transistor and to the second supply line in the case of the seventh transistor, the control electrode of the sixth transistor being connected to the first control line and the control electrode of the seventh transistor being connected to the second control line;
- the eighth transistor being connected via one of its secondary electrodes to the point of connection of the sixth transistor to the seventh transistor and via its other secondary electrode to the point of connection of the first transistor to the second transistor;

the ninth and tenth transistors being connected in series via one of their secondary electrodes, and being connected via their other secondary electrode to the control electrode of the eighth transistor in the case of the ninth transistor and to the second supply line in the case of the tenth transistor, the control electrode of the ninth transistor being connected to the second control line, and the control electrode of the tenth transitor being connected to the input terminal;

and the eleventh transistor being connected via one secondary electrode to the first supply line, via the other secondary electrode to the point of connection of the ninth transistor to the tenth transistor, and via its control electrode to the output terminal.

* * * * *